United States Patent [19]

Sekiguchi et al.

[11] Patent Number: 4,664,747
[45] Date of Patent: May 12, 1987

[54] SURFACE PROCESSING APPARATUS UTILIZING LOCAL THERMAL EQUILIBRIUM PLASMA AND METHOD OF USING SAME

[75] Inventors: Atsushi Sekiguchi; Hideo Mito, both of Fuchu, Japan

[73] Assignee: Anelva Corporation, Tokyo, Japan

[21] Appl. No.: 845,718

[22] Filed: Mar. 28, 1986

[30] Foreign Application Priority Data

Mar. 28, 1985 [JP] Japan .................................. 60-64298

[51] Int. Cl.$^4$ .............................................. B44C 1/22
[52] U.S. Cl. .................................. 156/643; 118/50.1; 118/620; 156/243; 156/345; 204/298; 204/192.32
[58] Field of Search ....................... 156/243, 345, 643; 118/620, 50.1; 204/298, 192 E, 192 C

[56] References Cited

U.S. PATENT DOCUMENTS

| | | |
|---|---|---|
| 4,316,791 | 2/1982 | Taillet .................................. 204/298 |
| 4,450,031 | 5/1984 | Ono et al. ............................. 156/345 |
| 4,462,863 | 7/1984 | Nishimatsu et al. ................. 156/643 |
| 4,512,868 | 4/1985 | Fujimura et al. ..................... 204/298 |
| 4,532,971 | 6/1985 | Cuomo et al. ........................ 156/345 |
| 4,569,719 | 2/1986 | Coleman ............................... 156/643 |
| 4,579,623 | 4/1986 | Suzuki et al. ................... 118/50.1 X |
| 4,581,100 | 4/1986 | Hatzakis et al. ..................... 156/643 |
| 4,600,464 | 7/1986 | Desilets et al. ...................... 156/345 |
| 4,609,428 | 9/1986 | Fujimura ............................... 156/643 |

Primary Examiner—Robert Lindsay
Attorney, Agent, or Firm—Pollock, VandeSande & Priddy

[57] ABSTRACT

In a surface processing apparatus, the LTE (Local Thermal Equilibrium) plasma is produced, instead of the glow discharge, in the discharge chamber. Then the LTE plasma is conducted into the reaction chamber. The surface of the substrate positioned in the reaction chamber is exposed to at least one of the radiation and the active species generated from the LTE plasma for performing the surface processing.

15 Claims, 10 Drawing Figures

FIG_3

FIG_4

SURFACE PROCESSING APPARATUS UTILIZING LOCAL THERMAL EQUILIBRIUM PLASMA AND METHOD OF USING SAME

BACKGROUND OF THE INVENTION

1. Field of the Invention

The present invention relates to an apparatus for performing various surface processing and a method of the surface processing, and in particular to an apparatus wherein predetermined radiation and/or an active species, are produced, are utilized so as to fabricate insulator films of semiconductor devices, semiconductor films, metal films, and to perform surface processing of etching, surface-cleaning, and surface reforming.

2. Description of Prior Art

An advanced progress is made recently in such a surface processing that a gas is activated by way of photochemical reaction, substance to be aimed is deposited on a substrate surface to form a thin film, the etching and surface reforming are performed. This is because the surface processing can be done at low temperatures, no damage caused by bombardment of charged particle occurs, novel processing can be employed due to the selectivity of photochemical reaction, and a selection of reaction steps and film forming control can be easily achieved.

The conventional methods for the photochemical surface processing are mainly classified into two categories: One method employs a discharge lamp as a light source. The other employs a laser. The former method has a drawback that, in general, intensity of radiation of the discharge lamp is low. The later has such a drawback that the cost of the laser assembly is very high.

In the typical processing apparatus, the light source is separated from the processing chamber by the window. In particular, contamination is deposited on this window in the photo assisted chemical vapor deposition or the like, resulting in attenuation of the radiation in this area.

In the conventional processing apparatus, there are various drawbacks such that the structure is complex, limitations exist in the kinds of the surface processing, and the film forming rate is inherently low.

Generally speaking, an active species, may be produced by irradiating light or electrons or the like to a substance. The activated condition by the light is limited to either the activated condition where the light transition is not prohibited, or the activated condition produced by the intersystem crossing or relaxation from the aforementioned activated condition. To the contrary, there is no such a limitation in the other activated condition which is produced by particle bombardments inside plasma, or electrons. That is, the transition can easily extend into the activated condition where the light transition is prohibited. As a result, the active species containing various kinds of harmful impurities are produced, which is completely different from the light activated condition.

Most prior art techniques for forming films by plasma have the following drawbacks. Since plasma is directly in contact with the substrate, it is damaged by bombardment by the harmful active species or the charged particle in plasma, causing the impurities to be injected into the substrate. Accordingly, electronic characteristics of semiconductor devices fabricated on this substrate are deteriorated. Such a deterioration of the electronic characteristics is emphasized in, for instance, variations in Vth of MOS type semiconductor devices and those in hfe of bipolar semiconductor devices. A degrees of integration of semiconductor devices tends to increase in the latest technology. Consequently, since even small bombardment of charged particle causes the electronic characteristics of such semiconductor devices to be deteriorated, there is a growing need to develop non-damage surface processing by employing the impurity-less active species and the non-bombardment light.

An object of the present invention is to provide a novel surface processing apparatus and a novel processing method wherein the highly pure, strong and useful radiation as well as the active species are produced in a stable condition, whereby the high-quality surface processing can be achieved in an industrially available processing rate.

SUMMARY OF THE INVENTION

The object of the present invention is accomplished by providing a surface processing method comprising the steps of:

generating local thermal equilibrium (LTE) plasma by conducting a predetermined gas into discharge space to which alternating power is being supplied;

producing at least one of radiation and an active species from the LTE plasma; and, conducting at least one of said radiation and active species to the surface of said substrate positioned out of the LTE plasma discharge space.

Furthermore, the present invention is characterized by employing a surface processing apparatus comprising:

reaction chamber means for storing a substrate to be surface-processed;

discharge chamber means connected to the reaction chamber means and for defining discharge space in conjunction with a predetermined gas and alternating power supplied thereto:

power source means for supplying the alternating power to the discharge chamber means so as to generate local thermal equilibrium (LTE) plasma in said discharge space, a ratio of a power capacity of said power source means to an opening area of said discharge space toward said substrate being selected to be a first predetermined value; and projection means for projecting at least one of radiation and an active species produced from the LTE plasma in said discharge chamber means to a surface of the substrate provided in said reaction chamber means.

BRIEF DESCRIPTION OF THE DRAWINGS

For a better understanding of the invention as well as other objects and further features thereof, reference is made to the following description which is to be read in conjunction with the accompanying drawings, wherein.

DETAILED DESCRIPTION OF THE INVENTION

Arrangement of First Embodiment

Figure 1:
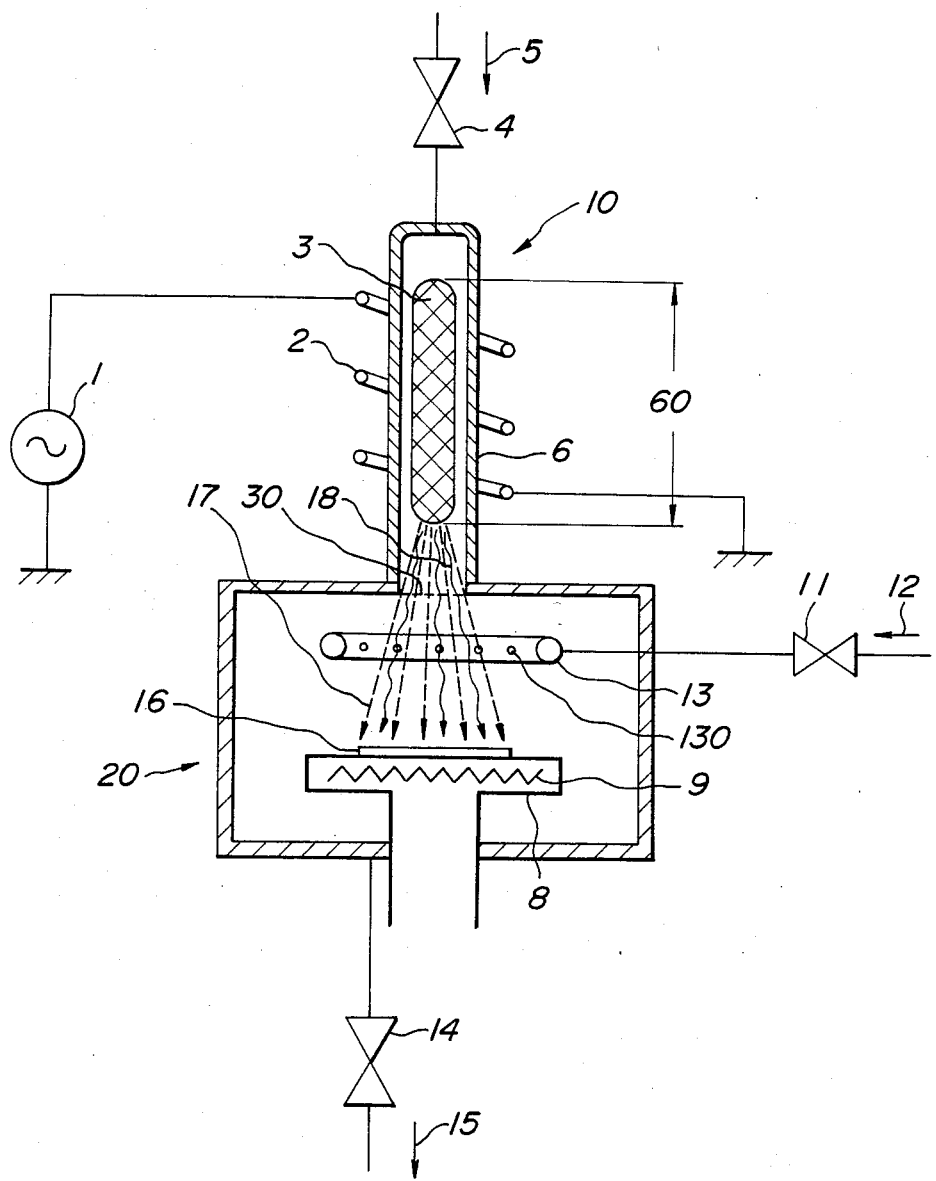
FIG. 1 is a schematic diagram of a surface processing apparatus according to a first mode of the invention.

Referring now to FIG. 1, there is shown a surface processing apparatus according to a preferred embodiment of the invention. A discharge chamber 10 is provided on a reaction chamber 20. The discharge chamber 10 is arranged by a radio frequency (several $KH_z$ to several hundreds of kilohertzs) power source 1, a coil 2 and a discharge lamp 6. When the radio frequency (RF) voltage produced in the RF power source 1 is applied to the coil 2, a discharge phenomenon occurs in a discharge space 60 within the discharge tube 6. This discharge space 60 is coupled by the radio frequency induction to the coil 2. Alternatively, a pair of plate-shaped electrodes sandwiching the discharge tube 6 are provided, instead of the coil 2, to form another discharge space 60 which is capacitive-coupled to the plate-shaped electrodes. When the radio frequency in the range of microwave frequency band (on the order of $GH_z$) is utilized for the RF power source 1, a microwave cavity, instead of the coil 2, is employed to surround the discharge tube 6. In this case, a discharge space for cavity resonance may be utilized. Into the discharge tube 6 where the above-described discharge occurs, a discharge gas is introduced via a valve 4 in a direction denoted by numeral 5. The discharge tube 6 is typically made of insulating materials that are preferably selected form silica glasses, ceramics or the like. In the case of silica glasses, this discharge tube 6 must be fabricated in a double tube construction of silica glasses because silica glasses might be melt due to a higher temperature phenomenon by discharged plasma. Cooling water flows through an internal space defined by the double tube construction.

Generation of Local Thermal Equilibrium Plasma

As the RF power supplied to the coil 2 is increased, firstly a radio frequency glow discharge occurs. When the RF power is furthermore increased, secondly luminescence from plasma is greatly increased, and it can be observed local thermal equilibrium plasma (referred to as "LTE plasma"). The most LTE plasma 3 is generated in hysteresis conditions. This LTE plasma 3 represents extremely high photoemission intensity, and a different spectrum from that of the normal DC (direct current) glow discharge.

When the introduced gas is hydrogen, for instance, a pontinuous spectrum covering the visible range to the ultraviolet range is firstly represented due to hydrogen particle in the stage of the DC glow discharge, or the RF glow discharge. In addition, the luminescence of both Balmar series and Lyman series can be simultaneously observed due to hydrogen atom. However, the luminescence due to these Balmar and Lyman series is reactively weak, so that the radiation color becomes white purple.

Figure 2:
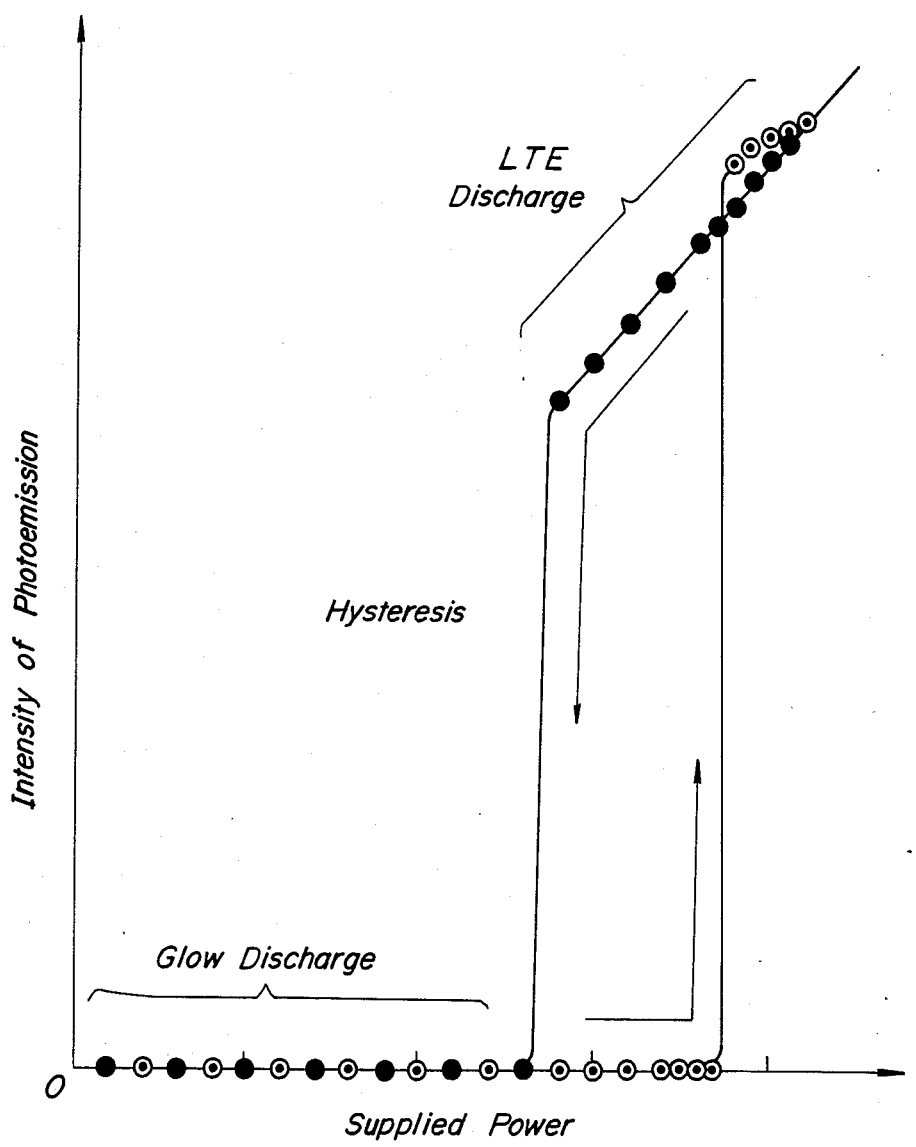
FIG. 2 is a graphic representation showing relations between the LTE plasma and the glow discharge.

In contrast with the above discharge, the red radiation having extremely high photoemission intensity can be observed when the LTE plasma 3 is produced. This is because the luminance of the Balmar series luminescence of hydrogen atom becomes very high. At the same time, although it is difficult to directly observe the Lyman series luminescence because it occurs out of the visible range, very high photoemission intensity of the Lyman series luminescence can be measured. FIG. 2 shows the above-described photoemission intensities versus supplying power.

It should be noted that the luminescent wavelength of the LTE discharge, which is one of the major features in generation of the LTE discharge, is determined by the sort of gas employed for the LTE discharge generation.

As is well known in the art, when the Lyman α (alpha) light having a wavelength of 121.6 nm is employed, silane and disilane can be directly decomposed. Furthermore, in this case, there is an advantage that optical transmission materials such as $MgF_2$, LiF and the like, as well as Al reflector coated by $MgF_2$ can be utilized, and thus an optical system can be very easily assembled. In the conventional apparatus, there was no adequate light source from which such a Lyman α light having high photoemission intensity can be driven, so that this Lyman α light is scarcely utilized in fact. In this respect, the above-described radio frequency LTE (local thermal equilibrium) plasma light becomes more important as the light source for the above purposes.

It should be understood that a single gas and a gas mixture of nitrogen, argon, helium, mercury or the like may be employed as the introduced gas of hydrogen, thereby generating the LTE discharge plasma from which useful high-intensity light can be emitted.

A detailed description will now be made of the LTE plasma. When hydrogen is employed as the introduced gas in the discharge space 60, it is recognized, based upon the optical emission spectroscopy, that a large quantity of exciting conditions of hydrogen atom and also hydrogen particle, hydrogen radical, activated core of ion etc. are present in the LTE plasma, as compared with the normal RF glow discharge. A fact that a plenty of activated core can be produced in the LTE plasma is the same as in other gases such as nitrogen.

Figure 3:
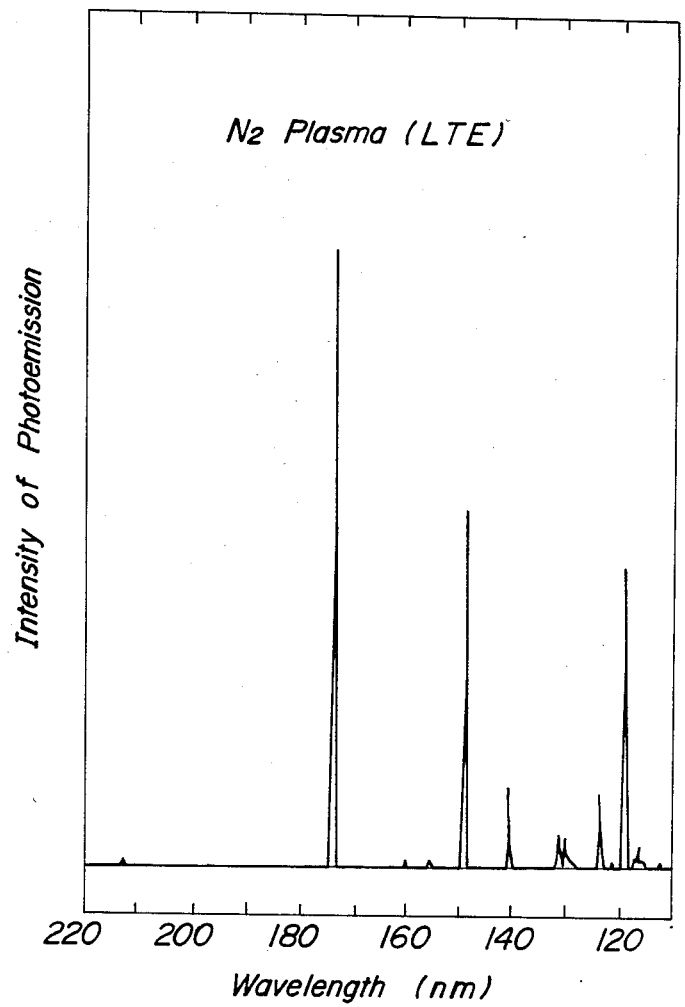
FIGS. 3 and 4 show the spectrum of the LTE and glow plasma.
Figure 4:
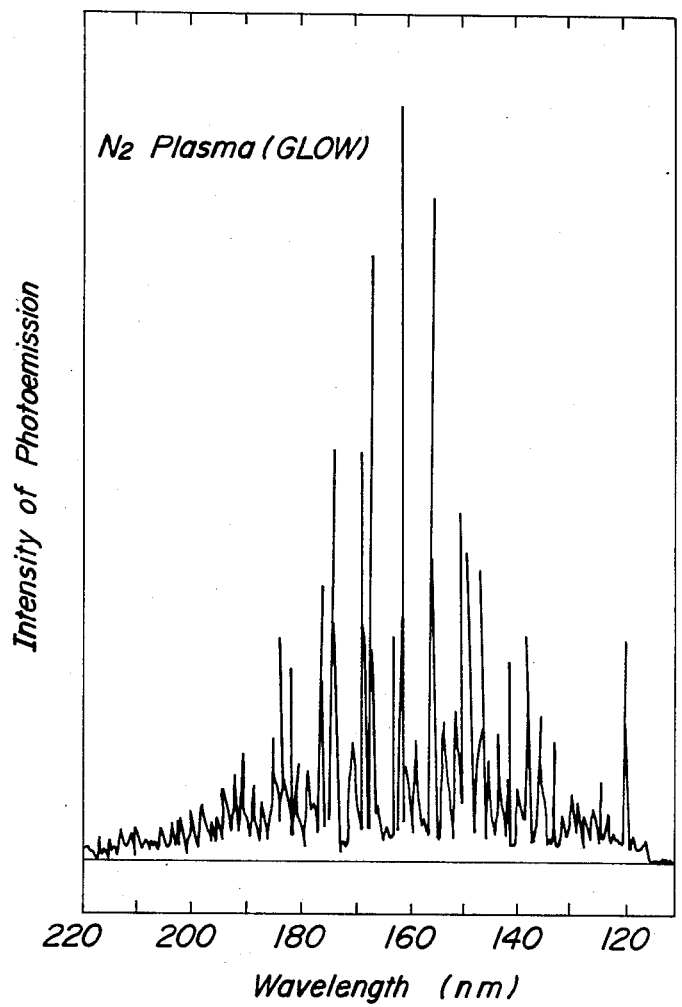

FIGS. 3 and 4 show results of the vacuum ultraviolet luminance spectra for a nitrogen gas. FIG. 3 illustrates optical emission spectrum for the nitrogen LTE plasma, whereas FIG. 4 represents optical emission spectrum for the RF glow plasma thereof. Both of the plasma were obtained in the same apparatus under the following conditions. The frequency was 13.56 $MH_z$, the supplying power was 2.5 KW, the pressure was selected to be less than 1 Torr (at least less than 10 Torrs), and the flow rate was chosen to be 30 sccm. According to the plasma forming condition of this apparatus since the LTE plasma forming condition is changed into the RF glow forming condition, and vice verse with the hysteresis phenomenon, a comparison can be made on these two conditions that are formed under the same condition. The scale of the ordinate indicating the intensity of the photoemission is determined in an arbitrary unit. However, the scale of the ordinate of the graphic representation showing the LTE plasma is reduced by approximately 100, as compared with that of the RF glow plasma. As a result, observing the intensities of both wavelengths of 120 nm, the photoemission intensity of the LTE plasma is 120 times higher than that of the RF glow plasma. Also in a case of nitrogen, the LTE plasma owns the strong intensity of short wavelength, and its spectrum belongs to the photoemission of nitrogen atom. Consequently, it can be seen that inside of the LTE plasma contains the activated cores, or seeds, particularly the nitrogen radical. The similar result can be obtained for other gases, i.e., hydrogen, oxygen, or the like.

Comparison Between Glow Discharge and LTE Plasma Discharge

The following results are obtained by comparing the RF glow discharge with the RF LTE plasma discharge. It should be noted that even if one or two of the following conditions are omitted, clear discrimination can be made in both plasma discharge.

(A) The photoemission portion of the RF (radio frequency) glow discharge tends to extend, whereas the radiant portion of the RF LTE plasma discharge tends to be localized.

(B) The spectrum patterns of both the discharge photoemission for generating the LTE plasma and the RF glow are different from each other. It can be judged that a difference exists in the electronic conditions, based on this pattern difference. When the gas is not monoatomic molecule, the excitation of an vibration and a rotation mode can be observed in the RF LTE plasma discharge. The excitation in the RF glow discharge is scarecely obserbed, as compared with the RF LTE plasma discharge.

(C) As previously described, the RF glow discharge condition is transferred to the RF LTE plasma discharge condition and vice verse, as parameters of the discharge power, the discharge pressure and the like, such a transition representing a hysteresis loop. Impedances of both discharge are greatly different from each other.

Also this transition between the RF glow discharge condition and the RF LTE plasma discharge condition substantially depends on the power supplied to the discharge chamber from the power source (will be discussed later in detail).

(D) The intensity, or photoemission of the RF LTE plasma is extremely higher than that of the RF glow discharge plasma, the difference of which is noticeable.

When the gas such as helium is employed, the high-intensity plasma is localized in the RF LTE plasma discharge condition, although the discharge impedance does not change with the hysteresis loop, so that it is difficult to discriminate the RF glow discharge condition from the RF LTE discharge condition by judging only the impedance differences. As a result, the discrimination can be made between these discharge conditions by observing the high photoemission intensity plasma.

Operation of First Arrangement

Referring back to the surface processing apparatus shown in FIG. 1, a description will be made of the reaction chamber 20.

The reaction chamber 20 is constructed from a reaction vessel 7 for keeping the air-tight condition, if necessary, a conducting ring 13 provided in the reaction vessel 7 for conducting reaction gas, and a substrate holder 8 for mounting a substrate 16 thereon.

Between the reaction chamber 20 and the discharge chamber 10, a mesh-shaped electrode 30 is provided for conducting the active species 18 produced from the LTE plasma 3 in the discharge chamber 10, alternatively the radiation 17 as well as the activated core to the surface of the substrate 16 provided in the reaction chamber 30.

Preselected reaction gas is conducted via the valve 11 into the hollow conducting ring 13 in the direction denoted by an allow 12. Then, the reaction gas is blown to the surface of the substrate 16 through many small holes 130 which are formed inside the conducting ring 13. Finally this reaction gas is supplied inside the reaction vessel 7. A temperature controller 9 is provided in the substrate holder 8 so as to control temperatures of the substrate 16 if desired.

Both the reaction gas in the reaction chamber and the conducted gas in the discharge chamber are exhausted from the reaction chamber 20 via a valve 14 in a direction indicated by an arrow 15. When the discharge chamber 10 is communicated with the reaction chamber 20 with forming a great communication hole, glow-like plasma extending to peripheral portions of the RF LTE plasma may sometimes extend within the reaction chamber 7. The functions of the mesh-shaped electrons 30 are to avoid such a plasma-extending phenomenon, and, on the other hand, to emphasize it.

It should be noted that the shape, materials and construction of this electrode 30 are not limited to the above-described mesh type electrode, but can be freely selected, provided that the glow-like plasma can be controlled to extend into the reaction chamber 20, and alternatively, the activated core 18, or both the radiation 17 and the activated core 18 are conducted to the surface of the substrate 16.

Applying certain voltage to this electrode 30 enables the shielding effect of the plasma to be emphasized, or, conversely, enables the charged particles to be effectively utilized for the surface processing by pulling the charged particles from the plasma and conducting them to the inside of the reaction chamber 20.

It is also possible to connect a capacitor having a proper capacitance between the electrode 30 and the ground line, so that a potential of the electrode is equal to the ground potential in the sense of the high frequency circuit, and it is equal to the stray potential in the sense of the DC circuit. In this case, the extraordinary discharge can be reduced and the shielding effect can be improved. Similarly, it is possible to interpose a bandpass filter between the electrode 30 and the ground line.

Figure 7:
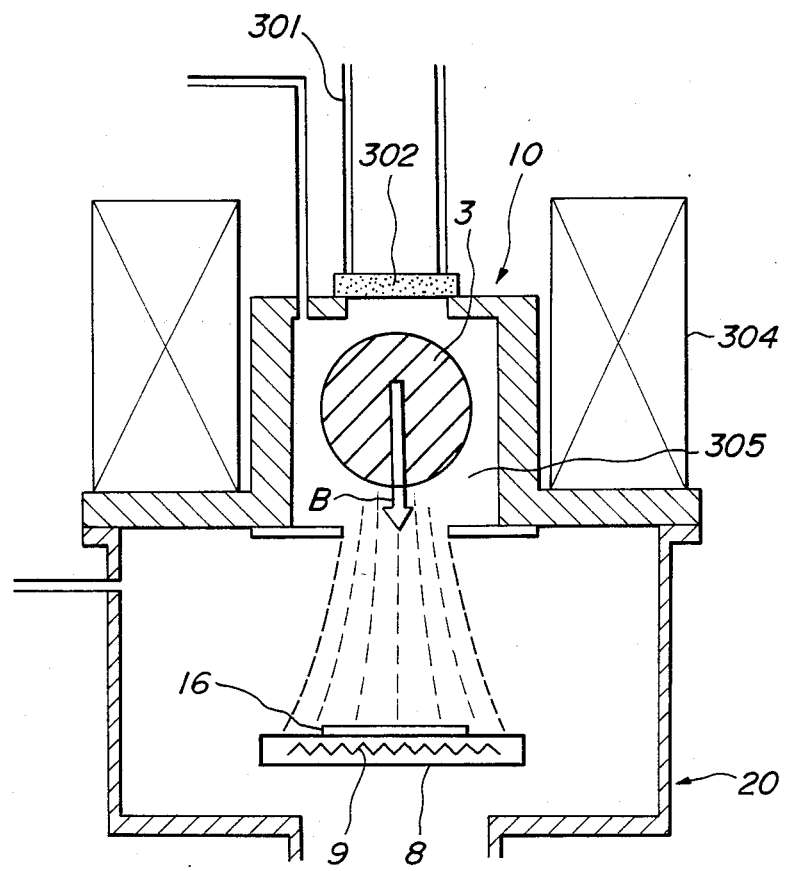
FIG. 7 is a schematic diagram of the first modification belonging to the first mode.

As shown in FIG. 7, it is possible to generate a magnetic field, instead of the electrode 30 so as to control the charged particle (will be discussed in detail). As simply explained, microwave power is supplied via a waveguide 301 and a microwave conducting window 302 to a cavity resonator 305 provided in a magnetic field "B" generated by an electromagnetic coil 304. The supplied microwave power produces the LTE plasma 3 in this cavity resonator 305. These elements form the discharge chamber 10. The charged particle in the LTE plasma 3 cascades on the substrate 16 after being accelerated in the diverging portion of the magnetic field "B".

It is also possible to efficiently utilize the glow-like plasma extending in the reaction chamber 20 without employing the electrode 30.

When a nitrogen gas was conducted in the discharge chamber 10 of the surface processing apparatus as shown in FIG. 1 and a silane gas was introduced into the reaction chamber 20, a SiN (silicon nitride) film was formed on the substrate 16 under the following condition. The temperature of the substrate was 200° C., the pressure was set at 700 m Torrs, the flow rate of SiH$_4$ gas was 25 sccm, the flow rate of an N$_2$ gas was 200 sccm, and the power of 3.5 KW was supplied (in the frequency of 13.56 MH$_z$).

When a hydrogen gas was conducted into the discharge chamber 10 in the same processing apparatus shown in FIG. 1 and a silane gas, or a disilane gas was introduced into the reaction chamber 20, a film of a—Si:H (amorphous silicon hydride) was formed on the surface of the substrate 16. This reaction mechanism may be understood as follows: A silane or a disilane gas was decomposed by the short wavelength light of Lyman series produced from the LTE plasma, the hydrogen radical filled the auxiliary role to pull the hydrogen atom from the silane or the disilane gas, which helps the formation of the a—Si:H film.

According to the invention, an oxygen gas is conducted into the discharge chamber 10 of the processing apparatus shown in FIG. 1 and the oxygen radical and osone (O$_3$) or the like are produced by employing the LTE plasma. Furthermore, organic compounds are decomposed into water and carbon dioxide by utilizing the short wavelength light of the oxygen gas and the oxygen radical or osone, so that the surface of the substrate can be cleaned. In this case, no conducting gas for the reaction chamber is required and thus the conducting ring 13 and the like are not necessary.

Modification of First Mode

Figure 8:
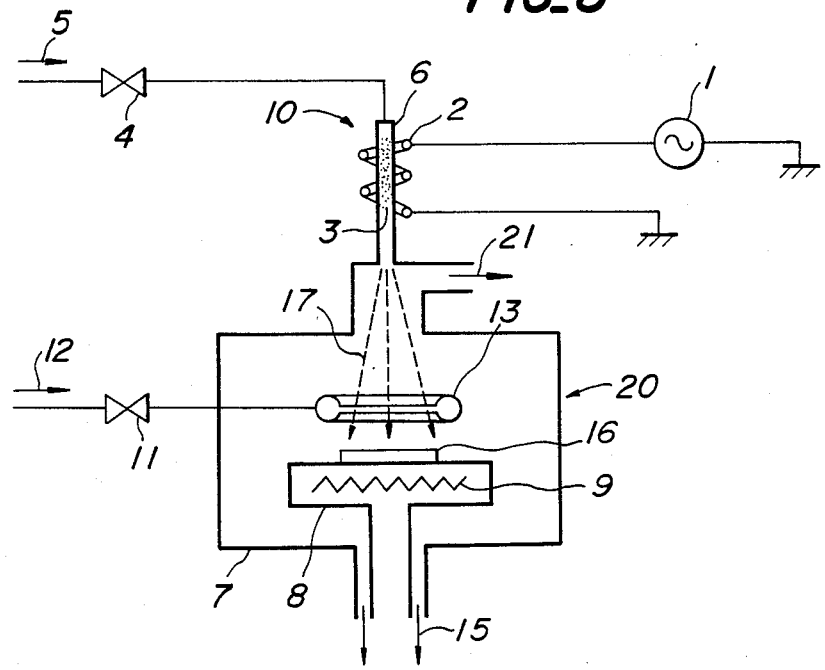
FIG. 8 is a schematic diagram of the second modification belonging to the first mode.

FIG. 8 illustrates another embodiment according to the first mode apparatus shown in FIG. 1 wherein only the radiation generated from the LTE plasma 3 is utilized. It should be noted that the same or similar components of FIG. 8 as those of FIG. 1 are denoted by the same reference numerals. As shown in FIG. 8, since a gas introduced into the discharge chamber 10 is exhausted as illustrated by an arrow 21 before reaching the reaction chamber 20, the activated core, or seed in the LTE plasma 3 does not function during the surface processing.

Figure 9:
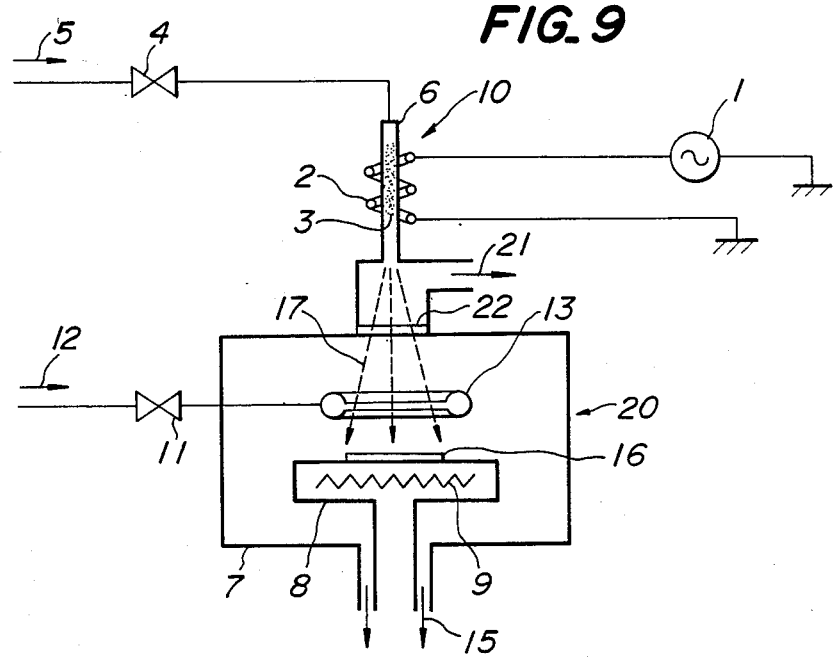
FIG. 9 is a schematic diagram of the third modification belonging to the second mode.

In FIG. 9, a further modified embodiment belonging to the first mode is illustrated wherein influences of the LTE plasma 3 are more strictly restricted during the surface processing than in the previous embodiment shown in FIG. 8. An optical window 22 is provided between the discharge chamber 10 and the reaction chamber 20. In other words, this optical window 22 is positioned in the interface between them. This optical window is not made of a glass, but crystals such as MgF$_2$, CaF$_2$, Al$_2$O$_3$ (sapphire) etc. Although this processing apparatus is utilized for the photo assisted CVD (chemical vapor deposition) processing, it may cause a problem of the cloudy optical window 22. However, no problem occurs when it is utilized for the photo etching, photo cleaning, or the like.

Figure 10:
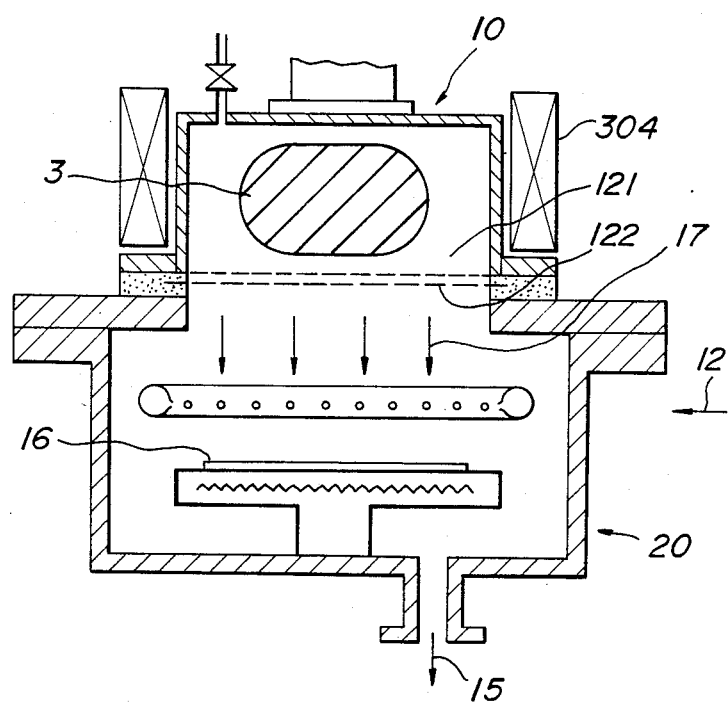
FIG. 10 is a schematic diagram of the fourth modification belonging to the first mode.

Referring now to FIG. 10, there is shown a surface processing apparatus using a microwave power source which is similar to the processing apparatus in FIG. 7. This processing apparatus includes the discharge chamber 10, the reaction chamber 20 and shielding light-grids 121 and 122. These light-grids are provided in a region between the discharge chamber 10 and the reaction chamber 20 and can pass only the activated core 17 of the LTE plasma 3 therethrough. An argon (Ar) gas is employed as a discharge gas and then the activated argon core, or seed having energy of approximately 11.5 to 11.7 eV in the LTE plasma 3. This active argon species is thereafter introduced into the reaction chamber 10. By using this energy of the activated argon core, the reaction gases SiH$_4$ (activated energy of approximately 6 eV); Si$_2$H$_6$ are dissociated so that an amorphous silicon film is deposited on the substrate 16.

In the apparatus shown in FIG. 10, not only an argon gas but also a helium (He) gas may be employed as the active species. When a H$_2$ gas is introduced as the discharging gas, the H$_2$ gas is dissociated by the LTE plasma to produce a large quantity of hydrogen atom and also the excited species of H and H$_2$. This can be understood from the fact that a color of the discharged H$_2$ is red in the LTE plasma. That is to say, the photoemission intensity of the H atom is considerably increased. This H atom is reacted with either SiH$_4$ or Si$_2$H$_6$ is decomposed. When using this reaction phenomenon, an a-Si (amorphous silicon) film can be formed at the substrate temperature less than approximately 500° C., whereas a polycrystal silicon film can be formed at the substrate temperature more than approximately 500° C.

If an NH$_3$ gas is employed at the discharge gas, a lot of N atom and H atom are produced inside of the LTE plasma. Such a phenomenon can be confirmed by spectro-analyzing the LTE plasma in such a manner that the photoemission of the N atom having wavelengths of 745.2 nm and 821.3 nm, and the photoemission of H atom are noticeably produced and the intensity of the Balmer series is extremely increased. When both the N atom and the H atom are utilized, they are reacted with SiH$_4$ and Si$_2$H$_6$ so that an SiN film fabricated on the surface of the substrate.

When an N$_2$O gas is conducted as the discharge gas, a plenty of O atom and N atom are produced inside of the LTE plasma. By utilizing this activated core to react either SiH$_4$ or Si$_2$H$_6$, an SiO$_2$ film can be formed (in the Auger electron spectroscopy, it cannot be observed that the N atom is contained).

Arrangement of Second Mode Apparatus

Figure 5:
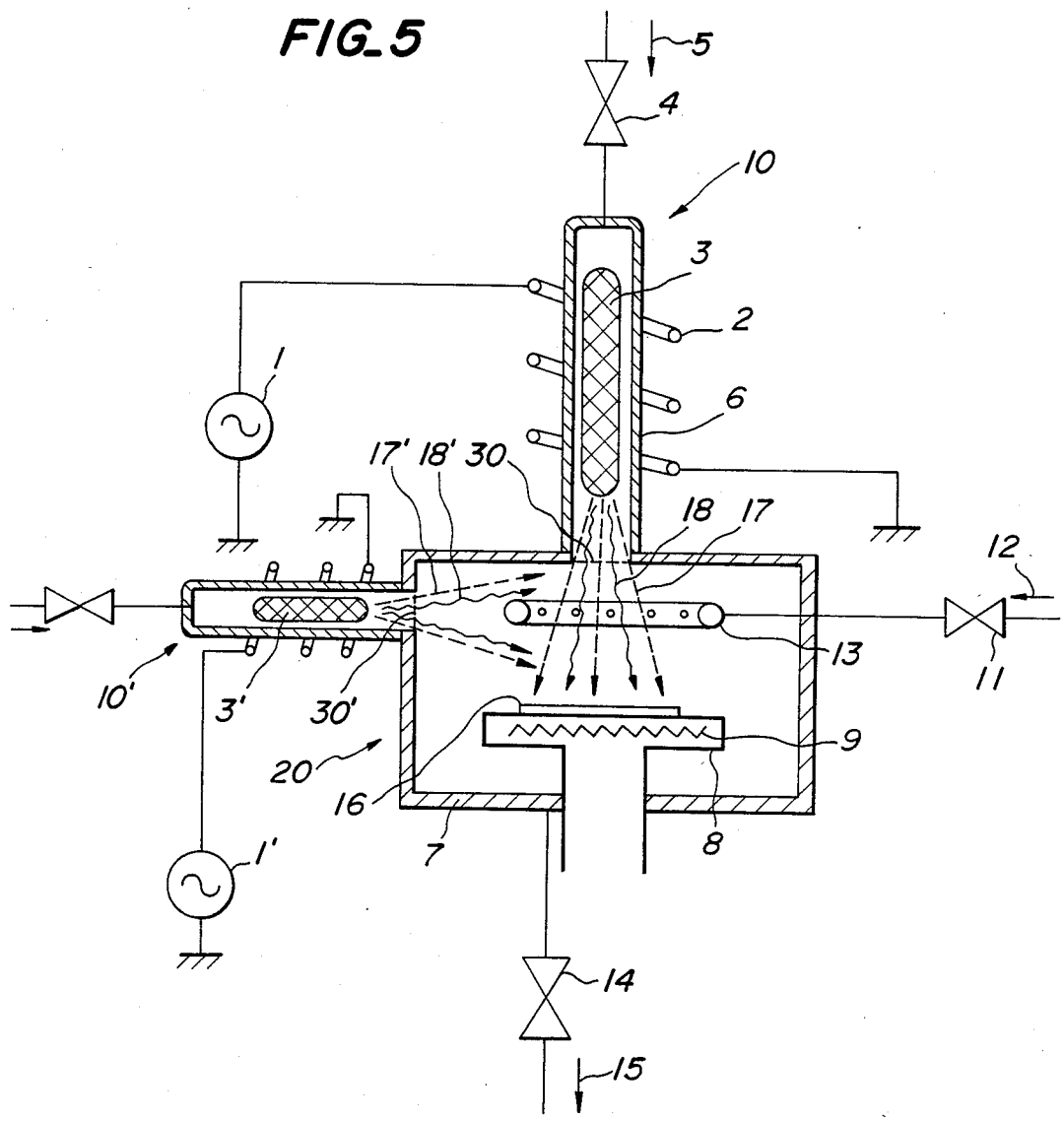
FIG. 5 is a schematic diagram of the surface processing apparatus according to a second mode of the invention.

Referring now to FIG. 5, a description will be made of a surface processing apparatus according to a second mode of the invention.

It should be noted that the same reference numerals are used herein to indicate the same or similar components of the first mode apparatus.

In the processing apparatus as shown, the discharge chamber of FIG. 1 is subdivided into two chambers denoted by 10 and 10'. Both the discharge chambers 10 and 10' are in face of a single substrate 16 to be processed in a single reaction chamber. In addition to the above-described discharge operation by one discharge chamber 10, radiation 17' and an active species 18'. Which are produced from LTE plasma 3' in the other discharge chamber 10' are conducted via an electrode 30' into the reaction chamber 20, and then are reacted with a predetermined reaction gas which has been separately conducted into this reaction chamber 20.

It is alternatively possible to employ a blind-shaped electrode instead of the above electrode 30', thereby shielding the radiation 17' originated from the LTE plasma 3' and simultaneously introducing only the activated core 18' into the reaction chamber 20. Conversely, it is possible to use an optical glass in the place of the electrode 30' so as to conducting only the radiation 17' into the reaction chamber 20 and shielding the activated core 18'.

We have confirmed by the experiment that when a hydrogen gas was conducted into one discharge chamber 10, a nitrogen gas was introduced into the other discharge chamber 10', and either a silane gas, or a disilane gas was utilized in the reaction chamber 20, an SiN (silicon nitride) film was formed on the surface of the substrate 16. Although the film forming mechanism could be analyzed, we could judge that the nitrogen radical generated from the LTE plasma produced in the other discharge chamber 10' in conjunction with the short wavelength light of the LTE plasma (the Lyman series of the hydrogen atom) produced in one discharge chamber 10 might be reacted with the silane in combination with the hydrogen radical generated from the LTE plasma produced in the former discharge chamber 10, thereby forming the SiN film.

It should be noted that when the radiation 17 (and 17') was shielded in the previous processing examples wherein both the radiation was utilized in conjunction with the activated core, or seed, there was substantially no film deposited on the substrate and no cleaning effect thereon. Consequently, it is understood that the radiation plays an important role in the surface processing according to the invention.

While the present invention has been described using merely a specific embodiment, it should be understood that further modifications of processing various kinds of the substrate can be realized.

Definition on Basic Idea of the Invention

The invention has been achieved based on the following recognition. For instance, there are many conventional surface processing apparatus the construction of which are substantially identical to that of the surface processing apparatus according to the invention. These conventional surface processing apparatus (the plasma assisted CVD apparatus) utilize only the glow discharge. Among these conventional surface processing apparatus, most of them can be utilized as the surface processing apparatus of the invention if the power supply density is merely increased.

In other words, whether one conventional surface processing apparatus can be also used as the inventive surface processing apparatus is determined by the photoemission intensity of the plasma generated in this apparatus, as previously described. The major cause of increasing the photoemission intensity is the power capacity of the power source connected to the apparatus. Precisely speaking, it is the power supply capability of the power source with respect to firstly volume of discharge space and secondly an opening area of the discharge space toward the substrate to be processed.

Detailed Description on Power Supply Capability

A detailed description will now be made of the above-described power supply capability.

An SiN (silicon nitride) film is one of the most important covering films for semiconductor devices, and has characteristics of solidity, precision and higher elasticity (anti-crack characteristic), and better step coverage. It is however rather difficult to obtain such a high quality SiN film. Since no damage is eagerly required to the substrate during the film forming step, the above-mentioned difficulty to obtain the high quality SiN film is necessarily emphasized. Nevertheless, in accordance with the need for precisely processing semiconductor devices, such a high quality SiN film is strongly required in the present semiconductor technology.

The SiN (silicon nitride) film is formed according to the conventional two method. Namely, in the first conventional film forming method, the SiN material is deposited on the target and sputtering-processed. The second forming method is the plasma assisted CVD (chemical vapor deposition) wherein the substrate to be processed is exposed in the glow discharge of the gas mixture containing the silane and nitrogen gases in addition to the ammonia gas. The SiN film formed by the first or second conventional methods cannot satisfy the above-described need. This is because the SiN film formed by the first conventional method has such drawbacks that the step coverage characteristic is very deteriorated, and moreover, the damage is very large. The SiN film formed by the second conventional method contains a lot of H gases decomposed from the ammonia gas, resulting in a lower quality.

In accordance with the experiment research to solve these conventional drawbacks, the inventors of the present invention could find out that the high quality SiN film could be formed by the above method and apparatus without any damage. However, even if the high quality SiN film could be manufactured, such a film forming method and/or apparatus is not useful in view of industrial utilization because of the slower forming rate. That is, an adequate higher film forming rate is absolutely required so as to assemble such a film forming step into the semiconductor device manufacturing steps (for instance, the film forming rate of the above plasma assisted CVD method can be practically utilized more or less by adding an ammonia gas into the gases).

The inventors of the present invention have decided in detail a surface processing apparatus by which at least a SiN (silicon nitride) film can be formed at a practical film forming rate. Accordingly, the film forming rate more than or equal to 100 Å (angstroms)/minute should be employed as the practical film forming rate for the industrial purposes. It should be considered that the minimum condition for the film forming industry in the film forming step within one batch would be less than one hour. As a result, a normal passivation film thickness must be more than or equal to 6,000 Å during one hour.

Considering that the LTE plasma is produced by conducting a nitrogen gas into the discharge chamber in order to form a SiN (silicon nitride) film in the surface processing apparatus shown in FIG. 1, the most significant factors are specific relations between the arrangement, the shape of the LTE plasma discharge chamber and the power supplied to the surface processing apparatus. When the discharge chamber is mainly manufactured by a cylindrical quartz tube, the relations between an inner diameter of the quarts tube and the supplied power give an important factor to the LTE plasma forming conditions.

Figure 6:
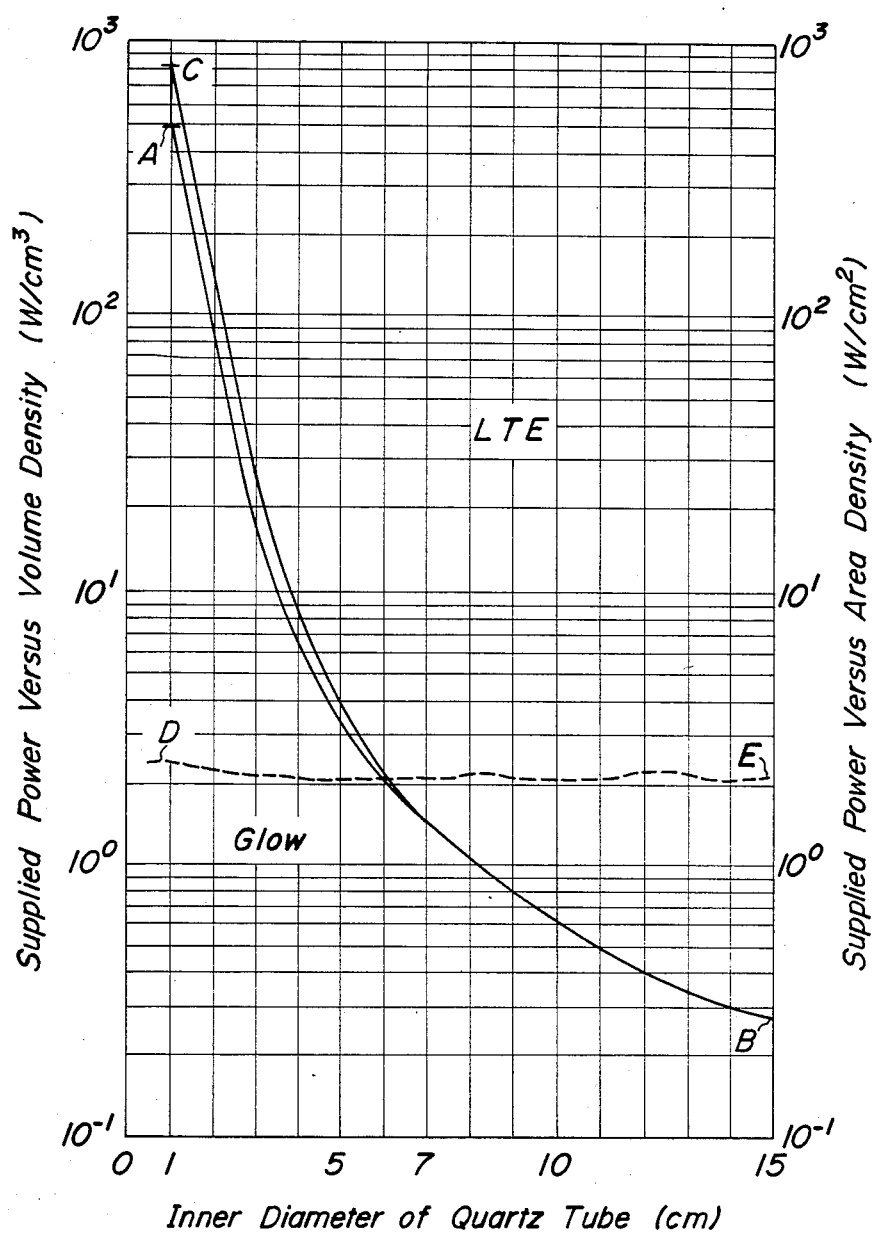
FIG. 6 is a graphic representation showing the relations between the density and the inner diameter of the quartz tube.

Curves A-B and C-B shown in FIG. 6 denote the specific relations between the inner diameter of the quartz tube (in the abscissa) and the supplied power versus volume density (in the ordinate). This density is defined by a ratio of the supplied power to the volume of the discharge space. The curve C-B of FIG. 6 indicates the density of the supplied power versus volume at which the glow condition (state) is transferred to the LTE condition (state) as the power is increased, whereas the curve A-B illustrates the supplied power versus volume density at which the LTE condition is transferred to the glow condition when the supplied power is decreased. Both the glow and LTE conditions (states) exist in a stable condition within a region surrounded by both curves A-B and C-B. Consequently it can be understood from these curves that the power source of the surface processing apparatus utilizing the LTE plasma should be capable of supplying the more power as defined by the curve C-B. Otherwise, a surface processing apparatus includes a trigger mechanism for producing the LTE plasma, the power source of which is capable of supplying the more power as defined by curve A-B.

As a result of the experiments executed by the present inventors, the above hysteresis phenomenon occurs, employing the quartz tube having the inner diameter of less than or equal to approximately 7 cm. As one example of the quartz tube having the inner diameter of 1 cm is employed, the glow condition begins to be changed into the LTE condition when the increased power reaches the supplied power/volume density of 820 W/cm$^3$, whereas the transformation from the LTE condition to the glow condition occurs at the power/volume density of 480 W/cm$^3$. Between the densities from 820 W/cm$^3$ to 480 W/cm$^3$, the LTE and glow conditions (states) are stably produced.

Accordingly, a comparison can be made between the glow condition and the LTE condition under the same conditions such as the power density, the pressure, the gas flow rate etc. When such a comparison is made of the short wavelength light necessary for the film forming, e.g., the photoemission intensity of the 120 nm light appearing in the transformation from the 2s$^2$ 2p$^2$ 3s ($^4$P) state to the 2s$^2$ 2p$^3$ ($^4$S) state of the nitrogen atom, the photoemission intensity of the LTE condition is noticeably increased by approximately two orders, as compared with that of the glow condition. It can also be obvious that the nitrogen atom density is considerably increased, as many nitrogen particles are dissociated in the LTE condition.

To the contrary, the above-described hysteresis phenomenon does not appear when the inner diameter of the quartz tube becomes more than 7 cm. In this case, the supplied power versus volume density is decreased. When the inner diameter of the quartz tube is selected to be 15 cm, the necessary supply power/volume density is equal to less than 0.2 W/cm$^3$. As a result of our experiments, the flow rate of the discharge gas can scarcely give an influence to the supplied power/volume density defined by these curves A-B and C-B. A change of the gas pressure is very small, say, less than 30%, even when the practical vacuum pressure varies from 300 m Torrs to 5 Torrs. Consequently, it is understood that the most useful factor, or indicator defining the LTE discharge feature is the supplied power versus volume density.

When investigating the presently available plasma assisted CVD (chemical vapor deposition) apparatus equiped with large discharge chambers, there is no CVD apparatus the supplied power/volume density of which exceeds 0.1 W/cm$^3$. This is because the conventional CVD apparatus never utilize such an idea of the LTE plasma employed in our invention. The ratio of the supplied power at the various conditions in the inventive apparatus shown in FIG. 6 is amount to several tens to several hundreds in case of a smaller diameter quartz tube.

Referring back to a graphic representation of FIG. 6, a D-E curve indicates the supplied power versus area density required for maintaining the acceptable film forming rate, i.e., more than or equal to 100 Å (angstroms)/minute. This density was obtained by the experiment and is defined by a ratio of the supplied power to the opening area of the discharge space toward the substrate to be processed.

Both the previous curves A-B and C-B are rapidly lowered as the inner diameter of the quartz tube is increased, whereas the present curve D-E always indicates the density of approximately 2 W/cm$^2$ even if the inner diameter of the quartz tube is changed.

It should be noted that although this D-E curve plots the measurement values in case of the cylindrical quartz tube, this technical idea, i.e., the opening area can also be applied to many other discharge space having different shapes from the cylindrical shape, because in case of utilizing only the radiation from LTE plasma so as to form the film on the substrate, the processing rate such as the film forming rate for the substrate is practically directly proportional to the radiation quantity per a unit area.

On the other hand, when only the active species are utilized to form the film on the substrate, the processing rate may be determined by the following relations.

The processing rate is directly proportional to the supply of the active species. Then, the supply of the active species is also directly proportional to the production quantity of the active species times the flow rate thereof, which is also directly proportional to a ratio of the radiation quantity per a unit area times the flow rate of the discharge gas to the opening area.

Consequently, it is apparent from the above relations that the flow rate of the active species is directly proportional to a ratio of the flow rate of the discharge gas to the opening area. To the contrary, it is not simply obvious that the production quantity of the active species is directly proportional to the radiation quantity per a unit area. This relation will now be explained by way of an example. The intensities of the photoemissions originated from the nitrogen LTE plasma, e.g., 120.0 nm (N3s$^4$P state to 2p$^4$S state), 149.3 nm (N3s$^2$P state to 2p$^2$D state) and 174.4 nm (N3s$^2$P state to 2p$^2$ P state) are sometimes very strong, as compared with the normal photoemission intensity of nitrogen. The photoemission species are generated inside of the LTE plasma at a constant probability due to the electron collision. These species become inactive at a substantially constant probability which is determined by the sorts of the photoemission species.

Furthermore, the quantity of the nitrogen atom produced inside of the LTE plasma is great, and the photoemission intensity of the nitrogen (N) atom is sufficiently higher than that of the nitrogen (N$_2$) particle (approximately 100 times, see FIGS. 3 and 4). Accordingly, by measuring the radiation quantity per a unit area, the concentration of the active species (i.e., nitrogen atom) present in the opening plane can be calculated. That is to say, the production amount of the active species is substantially directly proportion to the radiation quantity per a unit area.

The above-described theory can be also applied to other LTE plasma such as hydrogen and otehr gases.

In consequence, the processing rate such as the film forming rate can be expressed by the radiation rate per a unit area in case of using both LTE plasma radiation only, and the active species only. This relation is also illustrated by the D-E curve in FIG. 6.

Accordingly, merely measuring an opening area of discharge space enables the required data to be obtained. The supplied power should be increased to compensate for the following radiation losses. That is to say, a part of the radiation is shielded by the mesh-shaped electrode 30 provided between the discharge space 60 and the substrate 16 to be processed, or the radiation energy is considerably absorbed when the radiation is traveled in a long path between the discharge space 60 and the substrate 16. Accordingly, the power to be supplied must be increased in order to compensate for such a light attenuation. It should be understood that although the flow rate of the active species is specifically significant when only the active species are used, it can be intentionally determined because uniform surface processing of the invention such as the film forming and the etching must be realized, so that only the production quantity of the active species can be considered. In general, when the higher supplied power versus area density is used in the conventional plasma assisted CVD apparatus, the inner diameter of the quartz tube employed therein is less than 5 cm, i.e., the small plasma CVD apparatus. In the large plasma assisted CVD apparatus, this intensity is gradually reduced to finally one tenth of the intensity for the small CVD apparatus.

According to the invention, the above-described supplied power versus area density can also be utilized by defining the features of the surface processing apparatus.

When the present invention has been described by employing the surface processing apparatus wherein the SiN film can be formed, it is obvious that many other possibilities can be achieved in the surface processing apparatus by which better quality films other than the SiN film, e.g., a—Si:H films can be formed under the acceptable film forming rate. In other words, it is evident to those skilled in the art that many other modifications and changes can be easily conceived without departing from the technical spirit and scope of the present invention. Although, for instance, the previous embodiments mainly disclose the film forming, the surface etching can be achieved when a gas such as fluorine or chlorine is employed as the activated core, or seed. It is also possible to improve surfaces of substrates by oxidizing them with a gas belonging to an oxygen series, and alternatively by nitriding them with a gas belonging to a nitride series. It should be noted that these processing effects of the film forming, the etching and the surface improving can be applied not only to the inorganic compound field, but also to the organic compound field.

When the voltage for preventing the charged particles applied to the mesh-shaped electrode 30 is controlled to be lower, whereby the glow discharge plasma may extend over the substrate to be processed, the surface processing rate can be considerably increased, though a risk of collision damages is increased. This processing method may be useful depending upon its utilization.

To the contrary, there is no conventional plasma assisted CVD apparatus, the applied power versus area density of which is selected to be more than or equal to 0.2 W/cm$^2$.

It should be understood that when employing the material which is not easily reacted with the conducted active species, the plasma generation method utilizing the hot cathode may be utilized in the surface processing apparatus according to the apparatus by which better quality films other than the SiN film, e.g., a—Si:H films can be formed under the acceptable film forming rate. In other words, it is evident to those skilled in the art that many other modifications and changes can be easily conceived without departing from the technical spirit and scope of the present invention. Although, for instance, the previous embodiments mainly disclose the film forming, the surface etching can be achieved when a gas such as fluorine or chlorine is employed as the activated core, or seed. It is also possible to improve surfaces of substrates by oxidizing them with a gas belonging to an oxygen series, and alternatively by nitriding them with a gas belonging to a nitride series. It should be noted that these processing effects of the film forming, the etching and the surface improving can be applied not only to the inorganic compound field, but also to the organic compound field.

When the voltage for preventing the charged particles applied to the mesh-shaped electrode 30 is controlled to be lower, whereby the glow discharge plasma may extend over the substrate to be processed, the surface processing rate can be considerably increased, though a risk of collision damages is increased. This processing method may be useful depending upon its utilization.

To the contrary, there is no conventional plasma assisted CVD apparatus, the applied power versus area density of which is selected to be more than or equal to 0.2 W/cm$^2$.

It should be understood that when employing the material which is not easily reacted with the conducted active species, the plasma generation method utilizing the hot cathode may be utilized in the surface processing apparatus according to the invention.

In summary, the present invention can provide a novel method of processing a surface of a substrate as well as a surface processing apparatus in which the highly pure and strong radiation and also the active species are produced in a stable condition from the LTE plasma, thereby effectively performing the high quality surface processing at the industrially available processing rate.

What is claimed is:

1. A method for processing a surface of a substrate comprising the steps of:
   generating local thermal equilibrium (LTE) plasma by conducting a predetermined gas into discharge space to which alternating power is being supplied;
   producing at least one of radiation and an active species from the LTE plasma;
   conducting at least one of said radiation and active species to the surface of said substrate positioned out of the LTE plasma discharge space.

2. A surface processing apparatus comprising:
   reaction chamber means for storing a substrate to be surface-processed;
   discharge chamber means connected to the reaction chamber means and for defining discharge space in conjunction with a predetermined gas and alternating power supplied thereto:
   power source means for supplying the alternating power to the discharge chamber means so as to generate local thermal equilibrium (LTE) plasma in said discharge space, a ratio of a power capacity of said power source means to an opening area of said discharge space toward said substrate being selected to be a first predetermined value; and
   projection means for projecting at least one of radiation and an active species produced from the LTE plasma in said discharge chamber means to a surface of the substrate provided in said reaction chamber means.

3. An apparatus as claimed in claim 2, wherein said first predetermined value is more than or equal to 2 W/cm$^2$.

4. A surface processing apparatus comprising:
reaction chamber means for storing a substrate to be surface-processed;
discharge chamber means connected to the reaction chamber means and for defining dichargee space conjunction with a predetermined gas and alternating power supplied thereto;
power source means for supplying the alternating power to the discharge chamber means so as to generate local thermal equilibrium (LTE) plasma in said discharge space, a ratio of a power capacity of said power source means to volume of said discharge space being selected to be a second predetermined value; and
projection means for projecting at least one of radiation and an active species produced from the LTE plasma in said discharge chamber means to a surface of the substrate provided in said reaction chamber means.

5. An apparatus as claimed in claim 4, wherein said second predetermined value is more than or equal to 1 W/cm$^3$.

6. An apparatus as claimed in claim 2 or claim 4, wherein said discharge chamber means is made of a cylindrical quartz tube.

7. An apparatus as claimed in claim 6, wherein said cylindrical quartz tube has an inner diameter of less than or equal to 7 cm.

8. An apparatus as claimed in claim 2 or claim 4, wherein said alternating power of power source means is coupled by way of one of induction coupling, capacitive coupling and cavity resonance to said discharge space of the discharge chamber means.

9. An apparatus as claimed in claim 2 or claim 4, wherein said projecting means includes charged particles controlling means for controlling a travel of the charged particle.

10. An apparatus as claimed in claim 9, wherein said charged particle controlling means is a mesh-shaped electrode to which a predetermined biasing voltage is applied.

11. An apparatus as claimed in claim 9, wherein said charged particle controlling means is formed by a magnetic.

12. An apparatus as claimed in claim 2, or claim 4, wherein said discharge space is subdivided into a plurality of discharge sub-space for a single substrate provided in said reaction chamber means.

13. An apparatus as claimed in claim 12, wherein different sorts of gases are conducted into said plurality of discharge sub-space.

14. An apparatus as claimed in claim 2 or claim 4, wherein said predetermined gas conducted into said discharge space contains nitrogen (N$_2$), a gas conducted into said reaction chamber means contains at least one of monosilane, disilane, silane derivative and their mixture, and a silicon nitride (SiN) film is deposited on said surface of the substrate.

15. An apparatus as claimed in claim 12, wherein said plurality of discharge sub-space are formed by first and second discharge sub-space, a first gas conducted into said first discharge sub-space contains nitrogen (N$_2$), a second gas conducted into said second discharge sub-space contains hydrogen (H$_2$), at least one of monosilane, disilane, silane derivative and their mixture is conducted into said reaction chamber means without passing through said first and second discharge sub-space, thereby forming a silicon nitride film on said of the substrate.

* * * * *

UNITED STATES PATENT AND TRADEMARK OFFICE
CERTIFICATE OF CORRECTION

PATENT NO. : 4,664,747
DATED : May 12, 1987
INVENTOR(S) : Atsushi Sekiguchi, et al.

It is certified that error appears in the above-identified patent and that said Letters Patent is hereby corrected as shown below:

Column 1, line 33, change "later" to --latter--.

Column 2, line 2, change "degrees" to --degree--.

Column 2, line 5, change "particle" to --particles--.

Column 3, line 18, change "kilohertzs" to --kilohertz--.

Column 3, line 41, change "melt" to --melted--.

Column 3, line 58, change "pontinuous" to --continuous--.

Column 4, line 57, change "verse" to --versa--.

Column 5, line 25, change "an" to --a--.

Column 5, line 28, change "scarecely obserbed" to --scarcely observed--.

Column 5, line 32, change "verse" to --versa--.

Column 6, line 2, change "30" to --20--.

UNITED STATES PATENT AND TRADEMARK OFFICE
CERTIFICATE OF CORRECTION

PATENT NO. : 4,664,747
DATED : May 12, 1987
INVENTOR(S) : Atsushi Sekiguchi, et al.

It is certified that error appears in the above-identified patent and that said Letters Patent is hereby corrected as shown below:

Column 6, line 5, change "allow" to --arrow--.

Column 8, line 31, after "film" insert --is--.

Column 9, line 68, change "method" to --methods--.

Column 11, line 55, change "equiped" to --equipped--.

Column 12, line 56, change "proportion" to --proportional--.

Column 12, line 59, change "otehr" to --other--.

Column 13, delete lines 61 through 68.

Column 14, delete lines 1 through 26.

Column 15, line 10, change "dichargee" to --discharge--.

Signed and Sealed this

Twenty-sixth Day of April, 1988

Attest:

DONALD J. QUIGG

Attesting Officer

Commissioner of Patents and Trademarks